United States Patent
Henson et al.

(10) Patent No.: US 8,536,645 B2
(45) Date of Patent: Sep. 17, 2013

(54) TRENCH MOSFET AND METHOD FOR FABRICATING SAME

(75) Inventors: Timothy D. Henson, Torrance, CA (US); Ling Ma, Redondo Beach, CA (US); Hugo Burke, Wales (GB); David P. Jones, South Glamorgan (GB); Martin Carroll, Cardiff (GB)

(73) Assignee: International Rectifier Corporation, El Segundo, CA (US)

( * ) Notice: Subject to any disclaimer, the term of this patent is extended or adjusted under 35 U.S.C. 154(b) by 67 days.

(21) Appl. No.: 13/031,505

(22) Filed: Feb. 21, 2011

(65) Prior Publication Data
US 2012/0211825 A1    Aug. 23, 2012

(51) Int. Cl.
*H01L 29/78* (2006.01)
*H01L 21/336* (2006.01)

(52) U.S. Cl.
USPC   257/330; 257/327; 257/E21.41; 257/E29.262; 438/270

(58) Field of Classification Search
USPC ............... 257/327, 77, 330, 328, 382, 412, 257/413, E29.104, E21.41, E21.646; 438/270, 438/238, 257
See application file for complete search history.

(56) References Cited

U.S. PATENT DOCUMENTS

| | | | | |
|---|---|---|---|---|
| 5,521,111 | A * | 5/1996 | Sato | 438/244 |
| 5,795,804 | A * | 8/1998 | Jenq | 438/244 |
| 6,087,214 | A * | 7/2000 | Cunningham | 438/244 |
| 6,215,149 | B1 * | 4/2001 | Lee et al. | 257/328 |
| 6,403,432 | B1 | 6/2002 | Yu | |
| 7,049,668 | B1 * | 5/2006 | Hshieh | 257/401 |
| 7,473,604 | B2 | 1/2009 | Spring | |
| 7,875,919 | B2 * | 1/2011 | Booth et al. | 257/301 |
| 7,923,762 | B2 * | 4/2011 | Nagaoka | 257/288 |
| 2001/0028075 | A1 * | 10/2001 | Chen et al. | 257/296 |
| 2005/0266642 | A1 * | 12/2005 | Kubo et al. | 438/270 |
| 2007/0111446 | A1 * | 5/2007 | Spring | 438/259 |
| 2007/0170498 | A1 | 7/2007 | Hu | |
| 2010/0155833 | A1 * | 6/2010 | Sumida et al. | 257/330 |

* cited by examiner

*Primary Examiner* — Victor A Mandala
*Assistant Examiner* — Whitney T Moore
(74) *Attorney, Agent, or Firm* — Farjami & Farjami LLP

(57) ABSTRACT

According to an exemplary embodiment, a trench field-effect transistor (trench FET) includes a trench formed in a semiconductor substrate, the trench including a gate dielectric disposed therein. A source region is disposed adjacent the trench. The trench FET also has a gate electrode including a lower portion disposed in the trench and a proud portion extending laterally over the source region. A silicide source contact can extend vertically along a sidewall of the source region. Also, a portion of the gate dielectric can extend laterally over the semiconductor substrate. The trench FET can further include a silicide gate contact formed over the proud portion of the gate electrode.

20 Claims, 8 Drawing Sheets

TRENCH MOSFET AND METHOD FOR FABRICATING SAME

BACKGROUND OF THE INVENTION

1. Field of the Invention

The present invention is generally in the field of transistors. More specifically, the present invention is in the field of trench-based field-effect transistors.

2. Background Art

Power semiconductor devices, such as trench field-effect transistors (trench FETs), are widely used in a variety of electronic devices and systems. Examples of such electronic devices and systems are power converters, such as DC to DC converters, in which vertically conducting trench type silicon FETs, for instance, may be implemented as power switches. In power converters, power losses within the power switches, as well as factors affecting switching speed, are becoming increasingly important. For example, for optimal performance, it is desirable to reduce overall gate charge $Q_g$, gate resistance $R_g$, and ON-resistance $R_{dson}$ the power switches.

However, designing trench FETs to optimize performance for particular applications often involves tradeoffs, where improving one performance parameter degrades another. For example, reducing trench dimensions in a substrate can improve gate charge $Q_g$ and ON-resistance $R_{dson}$ at the expense of increased gate resistance $R_g$. More particularly, reducing trench dimensions can also reduce the effective conductive area of a gate electrode in the trench, thereby increasing gate resistance $R_g$. Thus, conventional trench FETs can be limited by trench dimensions in order to achieve acceptable overall performance. As such, it would be desirable to provide trench FETs which can have relatively improved gate resistance $R_g$, while achieving other performance parameters.

Thus, there is a need for trench FETs that can overcome the drawbacks and deficiencies in the art and a method for fabricating the same.

SUMMARY OF THE INVENTION

A trench MOSFET and method for fabricating same, substantially as shown in and/or described in connection with at least one of the figures, and as set forth more completely in the claims.

DETAILED DESCRIPTION OF THE INVENTION

The present invention is directed to a trench MOSFET and method for fabricating the same. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
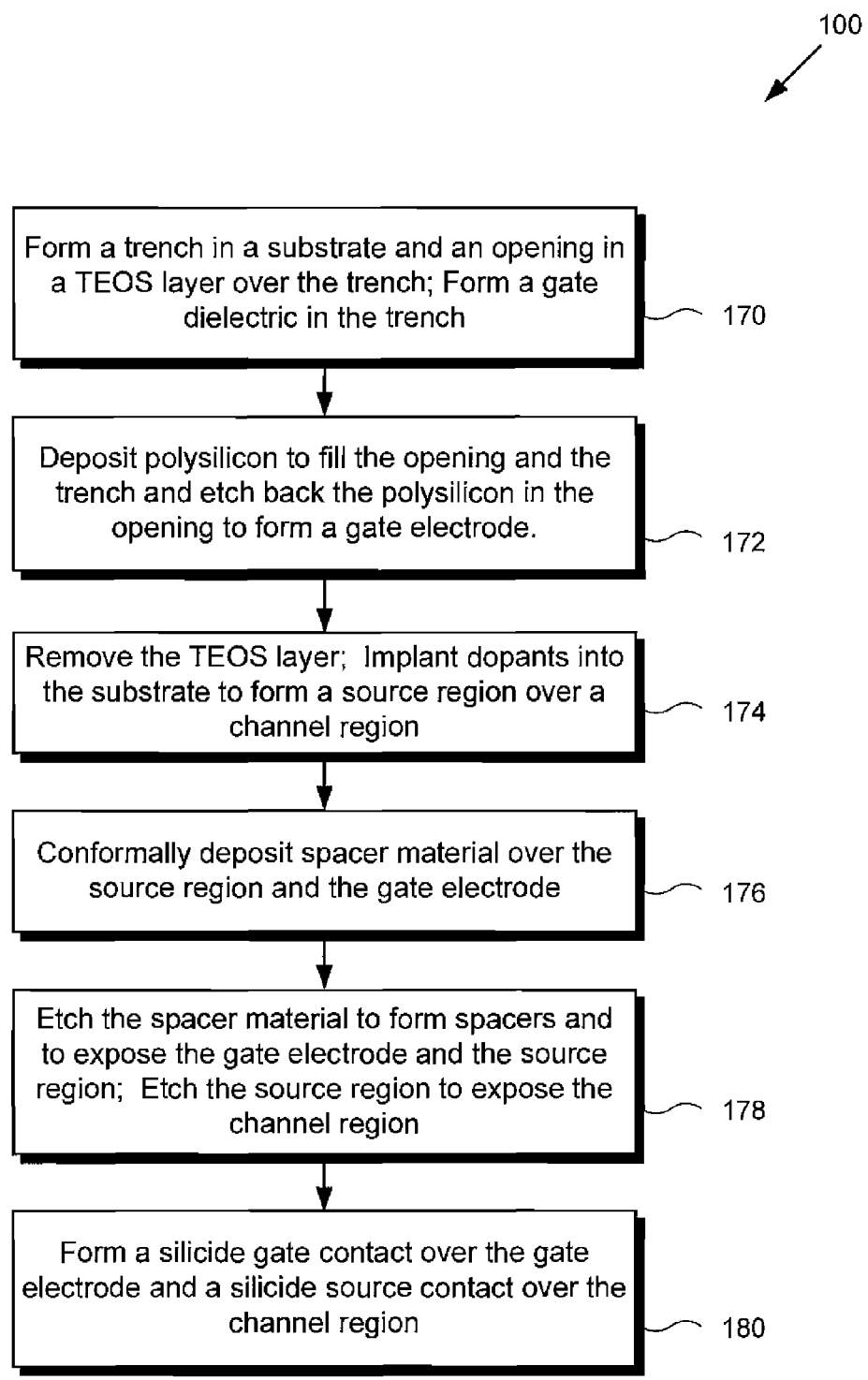
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; however, other embodiments of the invention may utilize steps different from those shown in flowchart 100. While steps 170 through 180 will be described with respect to fabricating an N channel device, it will be appreciated that the present invention is also applicable to P channel devices. It is noted that the processing steps shown in flowchart 100 are performed on a portion of processed wafer, which, prior to step 170, includes, among other things, a substrate, such as a silicon substrate and a TEOS layer formed over the substrate. The wafer may also be referred to simply as a wafer or a semiconductor die or simply a die in the present application.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
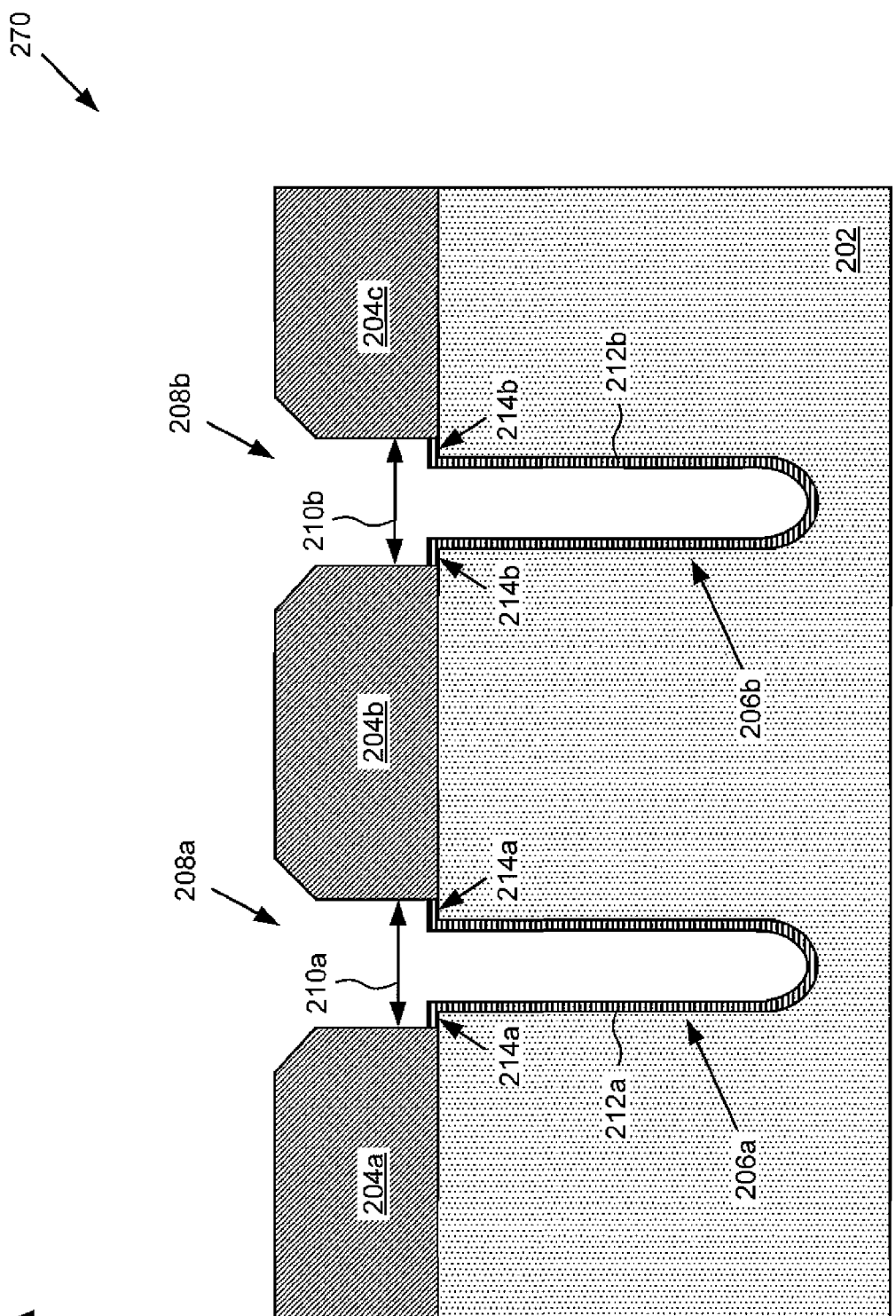
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows a structure including a substrate, after completion of step 170 of flowchart 100 in FIG. 1. Structure 270 includes substrate 202, which can be, for example, an N type silicon substrate, and TEOS material 204a, 204b, and 204c formed over substrate 202.

As shown in FIG. 2A, structure 270 further includes trenches 206a and 206b and respective openings 208a and 208b formed over trenches 206a and 206b. In structure 270, opening 208a is formed between TEOS material 204a and 204b and opening 208b is formed between TEOS material 204b and 204c. Trenches 206a and 206b and openings 208a and 208b can be formed, for example, by depositing a TEOS layer over a substrate. Photoresist can be deposited and patterned over the TEOS layer and openings can be formed in the TEOS layer (not shown in FIG. 2A). Thus, the TEOS layer can be used as a hard mask to form trenches 206a and 206b in substrate 202.

According to one embodiment, thermal oxide layers are grown in each trench 206a and 206b. Subsequently, a wet etch can be performed to remove the thermal oxide layers and to laterally extend the openings in the TEOS layer to widths 210a and 210b, thereby forming respective openings 208a and 208b, which are notably wider than respective trenches 206a and 206b. More particularly, because the etch rate of the thermal oxide layers is lower than the etch rate of the TEOS layer, the openings in the TEOS layer will etch at a faster rate than the thermal oxide layers during the wet etch. The wet etch can include an over etch, which can further extend the openings in the TEOS layer. Thus, gate dielectrics 212a and 212b can be formed in respective trenches 206a and 206b, each including respective portions 214a and 214b extending laterally in respective openings 208a and 208b over substrate 202. Gate dielectrics 212a and 212b can comprise, for example, silicon oxide (SiO2) formed by thermal oxidation. The result of step 170 of flowchart 100 is illustrated by structure 270 in FIG. 2A.

Figure 2B:
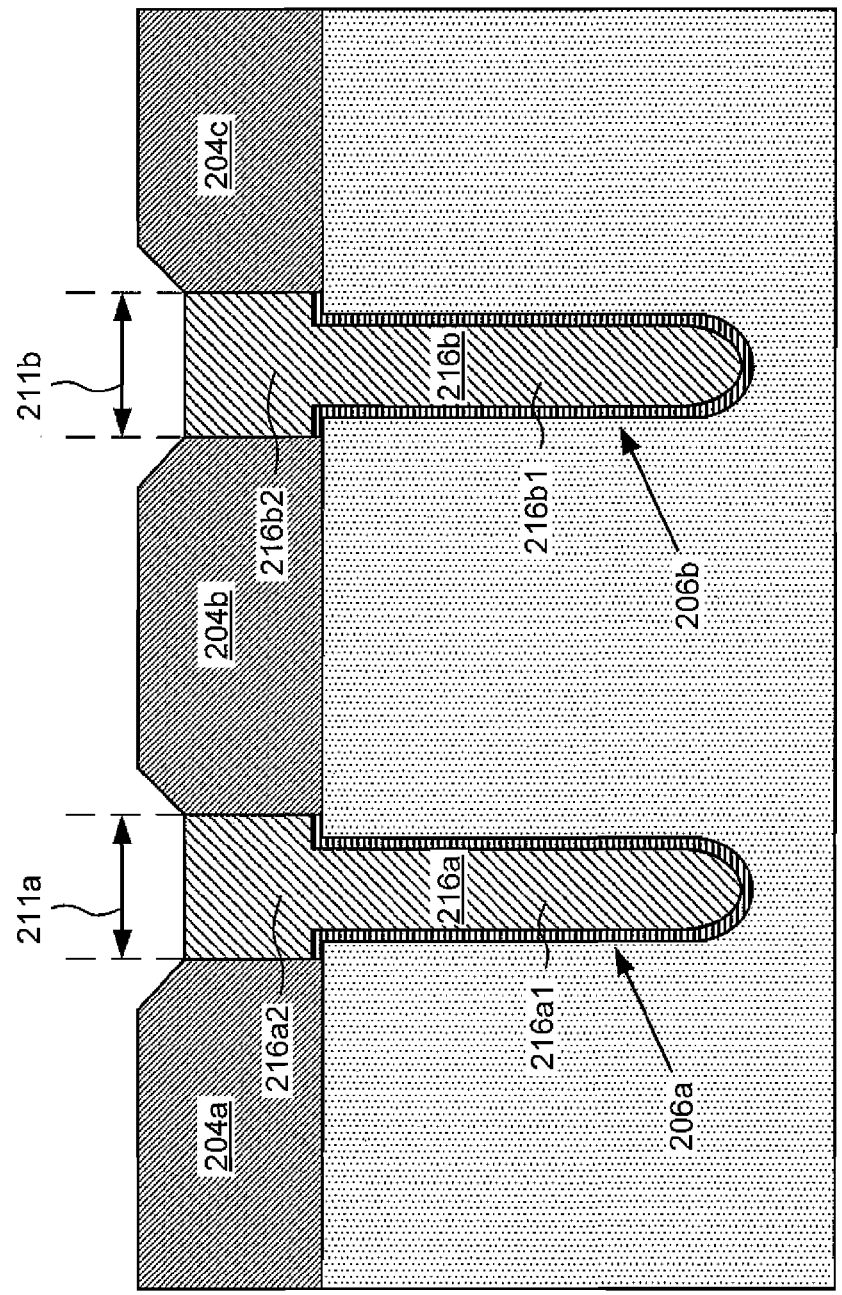
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, gate electrodes 216a and 216b are formed in respective trenches 206a and 206b and openings 208a and 208b. In structure 272, gate electrode 216a includes lower portion 216a1 formed in substrate 202 and proud portion 216a2 formed in opening 208a. Similarly, gate electrode 216b includes lower portion 216b1 formed in substrate 202 and proud portion 216b2 formed in opening 208b. Thus, proud portions 216a2 and 216b2 have respective widths 211a and 211b, which are greater than the widths of respective trenches 206a and 206b.

Gate electrodes 216a and 216b can be formed, for example, by depositing electrode material, such as, polysilicon into trenches 206a and 206b and openings 208a and 208b, and etching back the deposited polysilicon. In a specific example, the polysilicon can be etched back such that proud portions 216a2 and 216b2 each have a thickness greater than approximately 3000 Angstroms. The polysilicon can be highly doped and in some embodiments can be doped in-situ while in other embodiments it can be doped after being deposited. For example, for an N channel transistor, the polysilicon can be N++ in-situ doped polysilicon. The result of step 172 of flowchart 100 is illustrated by structure 272 in FIG. 2B.

Figure 2C:
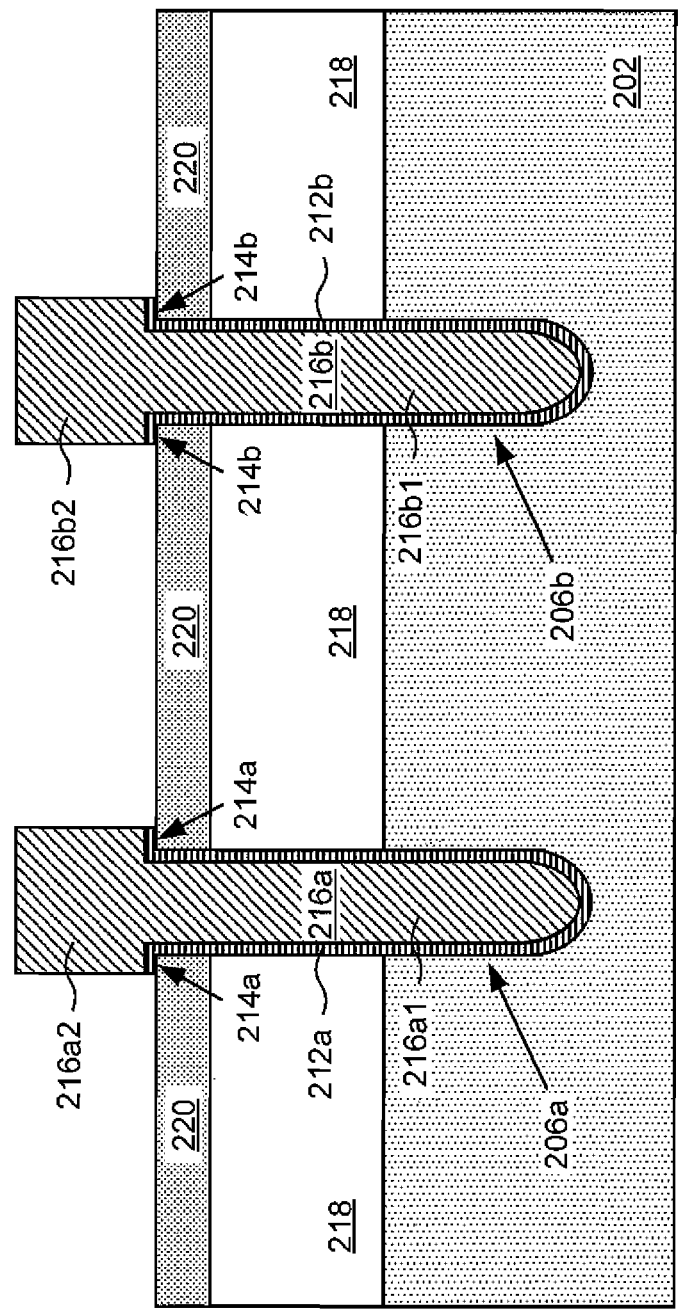
FIG. 2C illustrates a cross-sectional view, which includes a portion of a wafer processed according to an embodiment of the invention, corresponding to an intermediate step in the flowchart in FIG. 1.

Referring now to step 174 in FIG. 1 and structure 274 in FIG. 2C, at step 174 of flowchart 100, TEOS material 204a, 204b, and 204c is removed using, for example, a TEOS etchback. Notably, in removing TEOS material 204a, 204b, and 204c, gate dielectrics 212a and 212b are substantially maintained. More particularly, because proud portions 216a2 and 216b2 have respective widths 211a and 211b, which are greater than the uppermost width of respective trenches 206a and 206b, proud portions 216a2 and 216b2 can protect respective gate dielectrics 212a and 212b during removal of TEOS material 204a, 204b, and 204c. In one particular example, the uppermost width of trenches 206a and 206b can be approximately 0.2 to 0.3 microns and widths 211a and 211b of respective proud portions 216a2 and 216b2 can be approximately 0.3-0.4 microns.

As shown in FIG. 2C, channel regions 218 and source regions 220 are formed in structure 274. Channel regions 218 and source regions 220 can be formed, for example, by dopant implantation into substrate 202. For an N channel transistor, channel regions 218 can comprise P type regions and source regions 220 can comprise highly doped N type regions. Channel regions 218 are shown formed adjacent respective trenches 206a and 206b and below respective source regions 220. It is noted that, in the present example, widths 211a and 211b of respective proud portions 216a2 and 216b2 can be selected such that source regions 220 can substantially form under portions 214a and 214b of respective gate dielectrics 212a and 212b using dopant implantation.

Furthermore, in the present example, because channel regions 218 and source regions 220 are formed after trenches 206a and 206b, gate dielectrics 212a and 212b, and gate electrodes 216a and 216b, channel regions 218 and source regions 220 are not exposed to related process temperatures in forming those features and thus can be formed using more controlled temperatures if desired. However, it is reiterated that other embodiments of the invention may utilize steps different from those shown in flowchart 100. The result of step 174 of flowchart 100 is illustrated by structure 274 in FIG. 2C.

Figure 2D:
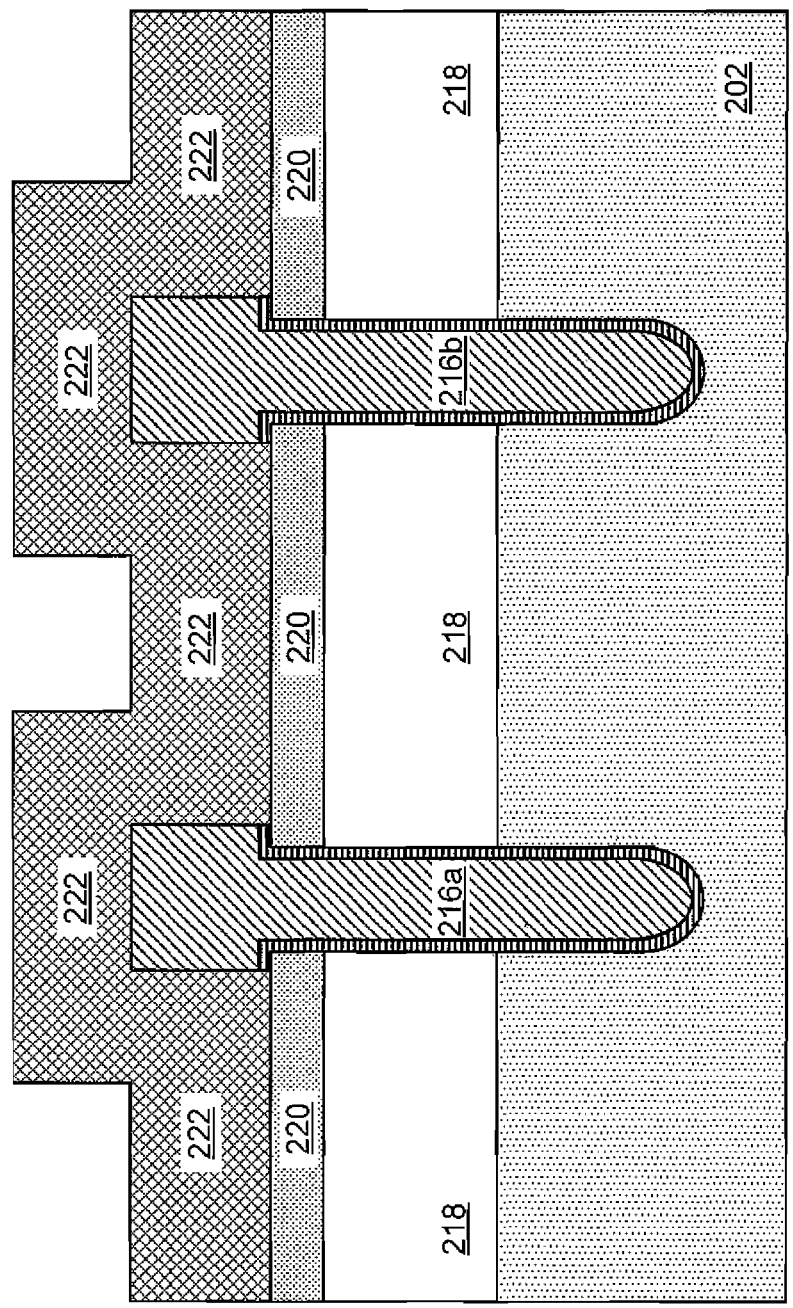
FIG. 2D illustrates a cross-sectional view, which includes a portion of a wafer processed according to an embodiment of the invention, corresponding to an intermediate step in the flowchart in FIG. 1.

Now referring to step 176 in FIG. 1 and structure 274 in FIG. 2D, at step 176 of flowchart 100, spacer material 222 is formed over substrate 202. For example, spacer material 222 can be formed by conformally depositing silicon oxide (SiO2) over substrate 202. The result of step 176 of flowchart 100 is illustrated by structure 276 in FIG. 2D.

Figure 2E:
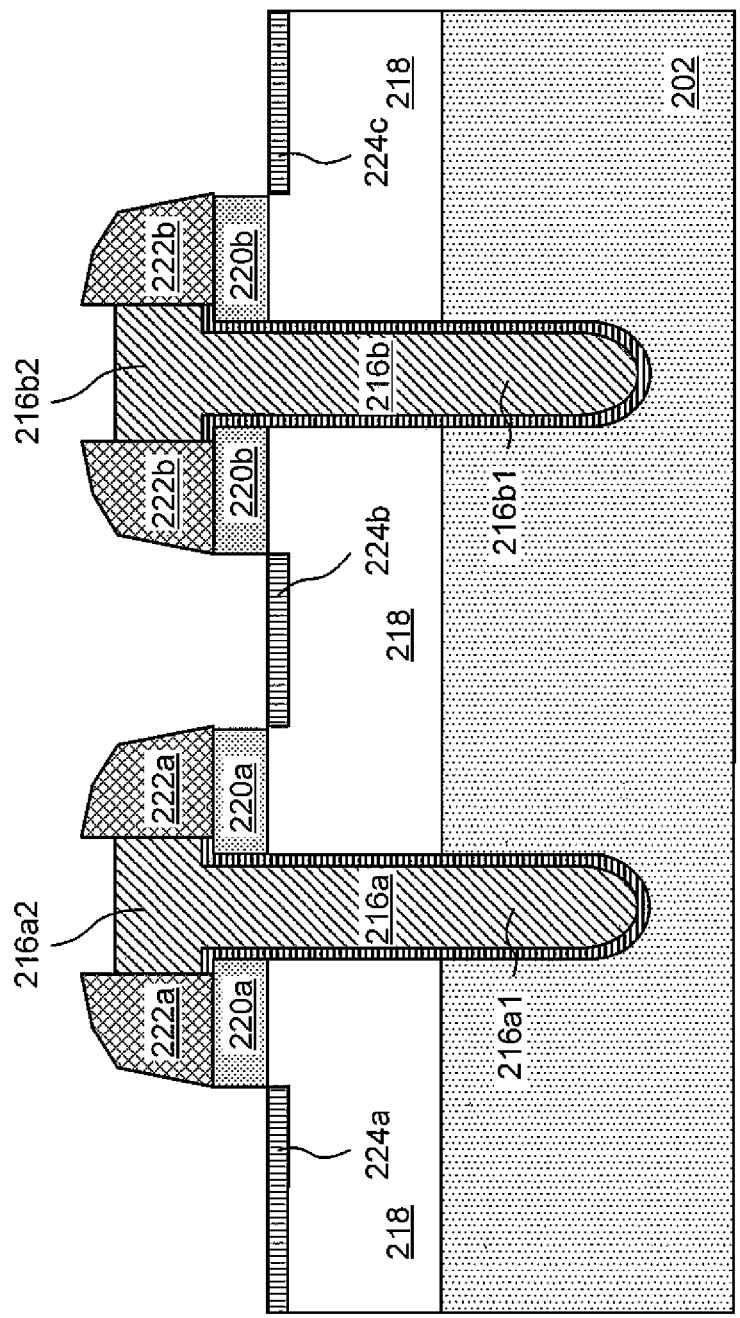
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 278 of flowchart 100, spacer material 222 is etched-back to form spacers 222a and 222b and to expose gate electrodes 216a and 216b and source regions 220. As shown in FIG. 2E, proud portions 216a2 and 216b2 of gate electrodes 216a and 216b are exposed. Also shown in FIG. 2E, spacers 222a are formed adjacent respective sidewalls of proud portion 216a2 and spacers 222b are formed adjacent respective sidewalls of proud portion 216b2.

Also in step 178, source regions 220 are etched to form source regions 220a and 220b and to expose channel regions 218, which, in the present example, can be accomplished using a self-aligned process with spacers 222a and 222b. As shown in FIG. 2E, source regions 220a are adjacent respective sidewalls of trench 206a and source regions 220b are adjacent respective sidewalls of trench 206b. Source regions 220a and 220b are further shown situated below respective proud portions 216a2 and 216b2 of gate electrodes 216a and 216b and above respective channel regions 218.

Also in step 278, contact regions 224a, 224b, and 224c can be formed over respective channel regions 218. In one embodiment contact regions 224a, 224b, and 224c can comprise highly doped P type regions formed, for example, using dopant implantation into channel regions 218. The result of step 178 of flowchart 100 is illustrated by structure 278 in FIG. 2E.

Figure 2F:
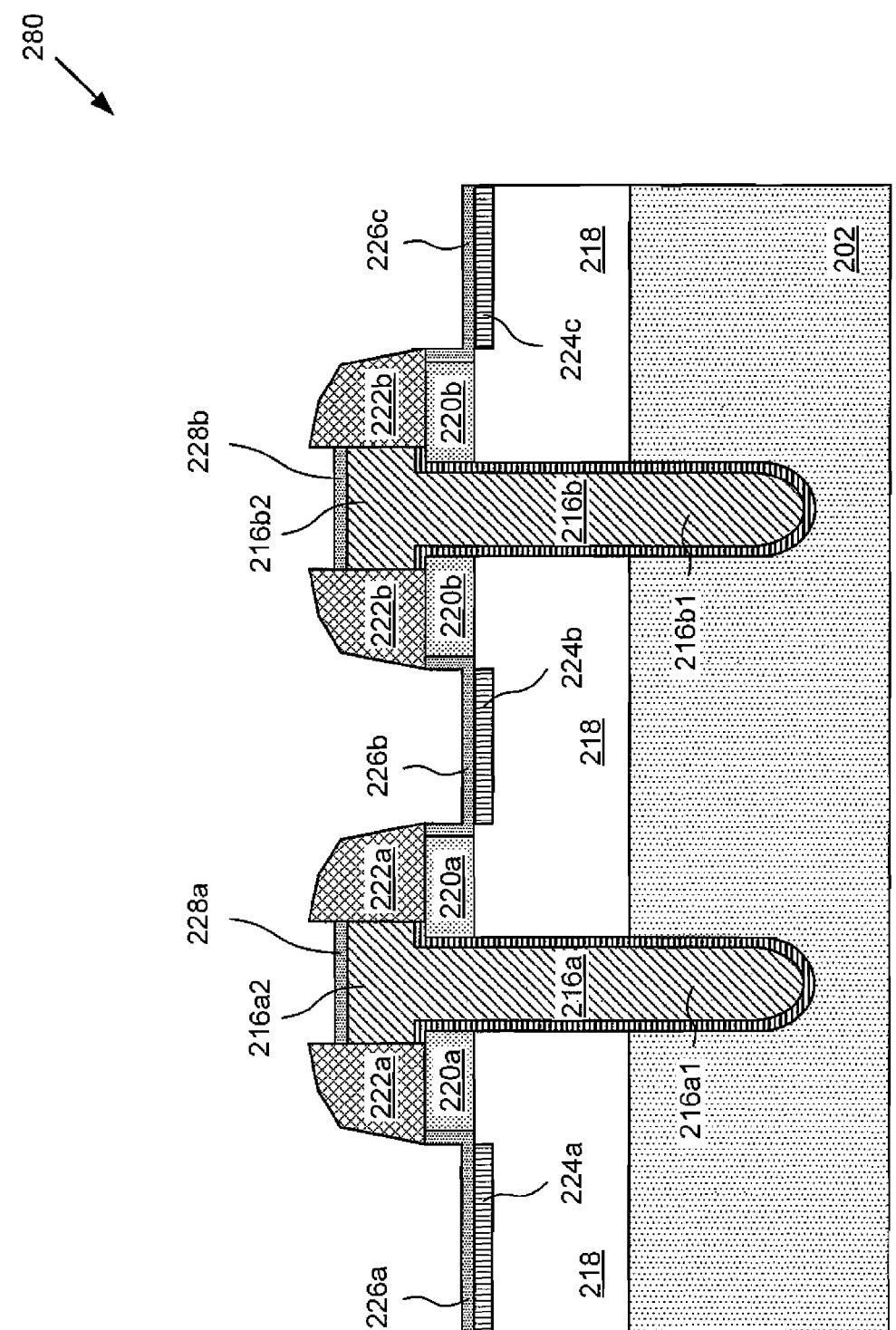
FIG. 2F illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2F, at step 180 of flowchart 100, silicide gate contacts 228a and 228b are formed over respective gate electrodes 216a and 216b and silicide source contacts 226a, 226b, and 226c are formed over respective channel regions 218. Silicide source contacts 226a, 226b, and 226c and silicide gate contacts 228a and 228b can be formed, for example, by depositing a metal over substrate 202, annealing the metal, and removing unreacted material. In one embodiment, for example, the metal can comprise titanium and silicide source contacts 226a, 226b, and 226c and silicide gate contacts 228a and 228b can comprise titanium silicide, however, other metals can be used to form other silicides.

In the embodiment shown in FIG. 2F, silicide source contacts 226a, 226b, and 226c extend laterally on respective contact regions 224a, 224b, and 224c. Also shown in FIG. 2F, silicide source contact 226a extends vertically on a sidewall of source region 220a, silicide source contact 226b extends vertically on a respective sidewall of source regions 220a and 220b, and silicide source contact 226c extends vertically on a sidewall of source region 220c.

Also in structure 280, silicide gate contact 228a is formed on proud portion 216a2 of gate electrode 216a and silicide gate contact 228b is formed on proud portion 216b2 of gate electrode 216b. The result of step 180 of flowchart 100 is illustrated by structure 280 in FIG. 2F.

Figure 2G:
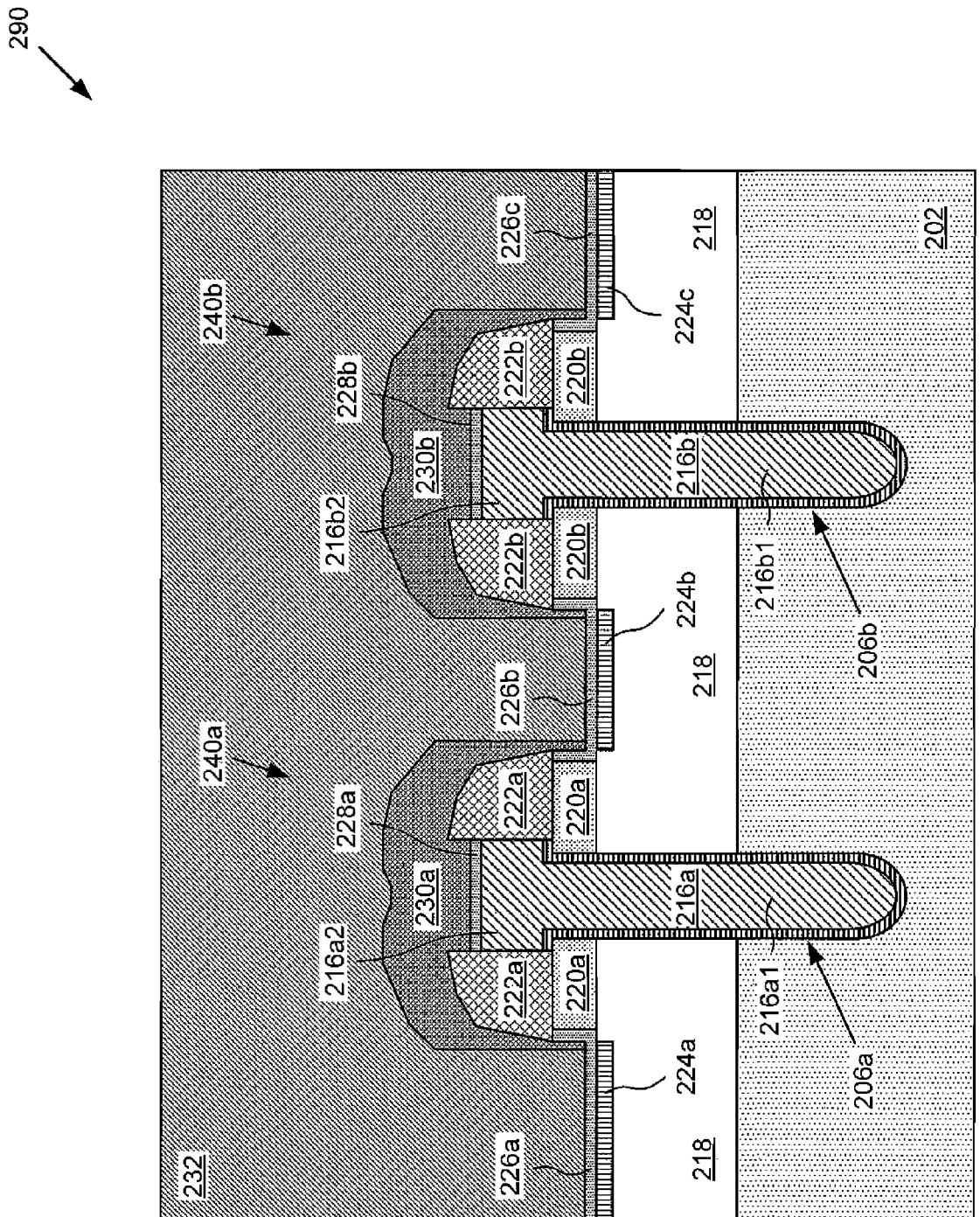
FIG. 2G is a cross-sectional view showing trench field-effect transistors fabricated according to one embodiment of the present invention.

Additional steps can be performed on structure 280 to form structure 290 including trench FETs 240a and 240b as shown in FIG. 2G. In some embodiments a dielectric layer comprising, for example, SiO2, can be conformally deposited over structure 280 and a photomask can be used to etch the dielectric layer to form dielectric caps 230a and 230b. In FIG. 2G dielectric caps 230a and 230b are formed over respective proud portions 216a2 and 216b2 of gate electrodes 216a and 216b. Subsequently, source metal 232 can be deposited over substrate 202, where dielectric caps 230a and 230b insulate respective gate electrodes 216a and 216b from source metal 232.

As shown in FIG. 2G, source metal 232 contacts source regions 220a and 220b through silicide source contacts 226a, 226b, and 226c. In the embodiment shown, each silicide source contact 226a, 226b, and 226c extends vertically on a sidewall of source region 220a and/or 220b, and laterally on respective contact regions 224a, 224b, and 224c. Thus, as shown in FIG. 2G, source metal 232 can contact source regions 220a and 220b in embodiments where, for example, dielectric caps 230a and 230b extend laterally over contact regions 224a, 224b, and 224c.

In transistors 240a and 240b, silicide gate contacts 228a and 228b provide a low resistance path for a signal from a gate contact (not shown in the Figures). Furthermore, silicide-gate contacts 228a and 228b extend along the length of respective gate electrodes 216a and 216b and are coupled to the gate contact (not shown in the Figures). In one specific example, the cross-section shown in FIG. 2G can be remote from the location at which the gate contact is coupled to silicide gate contacts 228a and 228b, while silicide gate contacts 228a and 228b provide a low resistance signal path along the length of gate electrodes 216a and 216b to the cross-section. Thus, silicide gate contacts 228a and 228b can reduce sheet resistance in transistors 240a and 240b.

Furthermore, as discussed above, the invention can provide for, for example, trench FET 240a including gate electrode 216a having lower portion 216a1 formed in substrate 202 and proud portion 216a2 formed over lower portion 216a1. As shown in FIG. 2G, proud portion 216a2 is situated above source regions 220a. Thus, proud region 216a2 can increase the effective conductive area of gate electrode 216a. Furthermore, proud region 216a2 can have a width 211a greater than lower portion 216a2, which can further increase the effective conductive area of gate electrode 216a. As such, proud portion 216a2 can significantly reduce gate resistance $R_g$, even when dimensions of trench 206a are maintained.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A trench field-effect transistor (trench FET) comprising:
   a trench formed in a semiconductor substrate, said trench including a gate dielectric disposed therein;
   a source region disposed adjacent said trench;
   a gate electrode including a lower portion disposed in said trench and a proud portion extending laterally over said source region; and
   a dielectric cap over said gate electrode, said dielectric cap extending laterally beyond an outer sidewall of said source region opposite said gate electrode.

2. The trench FET of claim 1 further comprising a silicide gate contact formed over said proud portion of said gate electrode.

3. The trench FET of claim 1, wherein a portion of said gate dielectric extends laterally over said semiconductor substrate.

4. The trench FET of claim 1 further comprising dielectric spacers formed adjacent respective sidewalls of said proud portion of said gate electrode.

5. The trench FET of claim 1, wherein said dielectric cap extends vertically along said outer sidewall of said source region.

6. The trench FET of claim 1, wherein a silicide source contact extends vertically along said outer sidewall of said source region.

7. The trench FET of claim 6 further comprising a channel region disposed adjacent said trench below said source region.

8. The trench FET of claim 7, wherein said silicide source contact extends laterally over said channel region.

9. A method for fabricating a trench field-effect transistor (trench FET) comprising:
   forming a trench in a semiconductor substrate, said trench including a gate dielectric disposed therein;
   forming a source region disposed adjacent said trench;
   forming a gate electrode including a lower portion disposed in said trench and a proud portion extending laterally over said source region; and
   forming a dielectric cap over said gate electrode, said dielectric cap extending laterally beyond an outer sidewall of said source region opposite said gate electrode.

10. The method of claim 9 further comprising forming a silicide gate contact over said proud portion of said gate electrode.

11. The method of claim 9, wherein a portion of said gate dielectric extends laterally over said semiconductor substrate.

12. The method of claim 9 further comprising forming dielectric spacers adjacent respective sidewalls of said proud portion of said gate electrode.

13. The method of claim 9, wherein said dielectric cap extends vertically along said outer sidewall of said source region.

14. The method of claim 9 further comprising forming a silicide source contact extending vertically along said outer sidewall of said source region.

15. The method of claim 14, wherein a channel region is disposed adjacent said trench below said source region.

16. The method of claim 15, wherein said silicide source contact extends laterally over said channel region.

17. A trench field-effect transistor (trench FET) comprising:
- a trench formed in a semiconductor substrate, said trench including a gate dielectric disposed therein;
- a source region disposed adjacent said trench;
- a gate electrode including a lower portion disposed in said trench and a proud portion extending above said source region, a silicide gate contact formed on said gate electrode; and
- a dielectric cap over said gate electrode, said dielectric cap extending laterally beyond an outer sidewall of said source region opposite said gate electrode.

18. The trench FET of claim 17, wherein said proud portion extends laterally over said source region.

19. The trench FET of claim 18, wherein a portion of said gate dielectric extends laterally over said semiconductor substrate.

20. The trench FET of claim 17 further comprising dielectric spacers formed adjacent respective sidewalls of said proud portion of said gate electrode.

* * * * *